(12) United States Patent
Mulbrook et al.

(10) Patent No.: US 7,436,921 B1
(45) Date of Patent: Oct. 14, 2008

(54) FREQUENCY SAMPLING PHASE DETECTOR

(75) Inventors: Mark M. Mulbrook, Marian, IA (US); Robert A. Newgard, Central City, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 604 days.

(21) Appl. No.: 10/982,968

(22) Filed: Nov. 5, 2004

(51) Int. Cl.
*H03D 3/24* (2006.01)
*H04L 7/00* (2006.01)

(52) U.S. Cl. .................. 375/376; 375/354; 375/355

(58) Field of Classification Search .............. 375/354, 375/371–376, 355
See application file for complete search history.

(56) References Cited

U.S. PATENT DOCUMENTS

| | | | | |
|---|---|---|---|---|
| 3,973,212 A | * | 8/1976 | Walloch | 331/14 |
| 4,068,199 A | * | 1/1978 | Madoff | 332/127 |
| 4,720,688 A | * | 1/1988 | Hasegawa et al. | 331/2 |
| 4,733,240 A | * | 3/1988 | Bradley | 342/372 |
| 5,339,050 A | * | 8/1994 | Llewellyn | 331/16 |
| 5,361,277 A | * | 11/1994 | Grover | 375/356 |
| 5,546,434 A | * | 8/1996 | Kalafatis | 375/376 |
| 5,557,648 A | * | 9/1996 | Ishihara | 375/376 |
| 5,592,125 A | * | 1/1997 | Williams | 331/1 A |
| 5,594,388 A | * | 1/1997 | O'Shaughnessy et al. | 331/1 R |
| 5,594,735 A | * | 1/1997 | Jokura | 370/337 |
| 5,727,038 A | * | 3/1998 | May et al. | 375/376 |
| 5,764,711 A | * | 6/1998 | Jokura | 375/376 |
| 5,774,023 A | * | 6/1998 | Irwin | 331/17 |
| 5,790,613 A | * | 8/1998 | Tateishi | 375/376 |
| 5,838,205 A | * | 11/1998 | Ferraiolo et al. | 331/2 |
| 5,872,520 A | * | 2/1999 | Seifert et al. | 340/5.61 |
| 5,909,474 A | * | 6/1999 | Yoshizawa | 375/376 |
| 5,953,386 A | * | 9/1999 | Anderson | 375/376 |
| 6,154,511 A | * | 11/2000 | Nakamura et al. | 375/375 |
| 6,229,864 B1 | * | 5/2001 | DuFour | 375/375 |
| 6,347,128 B1 | * | 2/2002 | Ransijn | 375/376 |
| 6,356,612 B1 | * | 3/2002 | Mitsutani | 375/376 |
| 6,388,536 B1 | * | 5/2002 | Welland | 331/177 R |
| RE37,751 E | * | 6/2002 | Sutardja | 327/100 |
| 6,463,112 B1 | * | 10/2002 | Hafez et al. | 375/376 |
| 6,496,555 B1 | * | 12/2002 | Soda | 375/376 |
| 6,549,598 B1 | * | 4/2003 | Kumaki | 375/376 |
| 6,614,866 B2 | * | 9/2003 | Hafez et al. | 375/376 |
| 6,704,383 B2 | * | 3/2004 | Lee et al. | 375/376 |
| 6,930,628 B2 | * | 8/2005 | Reinhold et al. | 341/155 |
| 6,954,510 B2 | * | 10/2005 | Lee | 375/373 |
| 6,965,660 B2 | * | 11/2005 | Strohmayer | 375/376 |
| 6,973,149 B2 | * | 12/2005 | Fyvie | 375/364 |
| 7,054,404 B2 | * | 5/2006 | Saeki | 375/376 |
| 7,092,474 B2 | * | 8/2006 | Cao | 375/375 |
| 7,173,497 B1 | * | 2/2007 | Mulbrook et al. | 331/74 |
| 2002/0094054 A1 | * | 7/2002 | Lee | 375/376 |

(Continued)

*Primary Examiner*—Chieh M. Fan
*Assistant Examiner*—Jason M. Perilla
(74) *Attorney, Agent, or Firm*—Nathan O. Jensen

(57) ABSTRACT

The present invention is an apparatus for determining the phase difference between a reference frequency signal and an input signal. The frequency sampling phase detector of the present invention may include a phase detector coupled with sample and hold circuitry. The frequency sampling phase detector of the present invention may reduce the frequency of an input signal suitable for proportional and linear phase detection by the phase detector. Advantageously, the frequency sampling phase detector of the present invention may reduce power consumption over conventional phase detectors in combination with frequency dividers.

13 Claims, 6 Drawing Sheets

U.S. PATENT DOCUMENTS

| | | |
|---|---|---|
| 2002/0136342 A1* | 9/2002 | Lee et al. .................... 375/376 |
| 2002/0191728 A1* | 12/2002 | Hafez et al. ................. 375/376 |
| 2003/0142775 A1* | 7/2003 | Takeshita et al. ............ 375/376 |
| 2004/0008805 A1* | 1/2004 | Xiu et al. .................... 375/376 |
| 2005/0213696 A1* | 9/2005 | Totsuka et al. .............. 375/376 |
| 2005/0220182 A1* | 10/2005 | Kuwata ....................... 375/226 |
| 2006/0045222 A1* | 3/2006 | Kim et al. ................... 375/354 |
| 2006/0062339 A1* | 3/2006 | Briones ....................... 375/375 |
| 2007/0071156 A1* | 3/2007 | Gregorius et al. ............ 375/376 |
| 2007/0116169 A1* | 5/2007 | Robbe et al. ................ 375/376 |

* cited by examiner

FREQUENCY SAMPLING PHASE DETECTOR

CROSS REFERENCE TO RELATED APPLICATIONS

The present application is related to United States Application Express Mail Label Number EV 515 456 016 US Ser. No. 10/982,969 filed on Nov. 5, 2004. Said United States Application Express Mail Label Number EV 515 456 016 US filed on Nov. 5, 2004 is hereby incorporated by reference.

FIELD OF THE INVENTION

This invention relates generally to a phase detector and more particularly to a frequency sampling phase detector.

BACKGROUND OF THE INVENTION

Mobile devices such as cellular phones typically rely upon a rechargeable battery as a power source. A reduction in power consumption by components of the mobile device may provide a longer operating capacity for the mobile device. Similarly, all components and devices which rely upon a fixed amount of power may benefit from a reduction in power consumption.

Phase-locked loops are employed in a variety of applications, such as mobile devices, for frequency control. Phase-locked loops may be utilized as frequency synthesizers where it is necessary to generate a precise signal with low spurs and noise. Referring to FIG. 1, a phase-locked loop 100 known to the art typically includes a number of components such as a reference frequency input 110, phase detector 120, a voltage controlled oscillator 130 and a frequency divider 140. A drawback associated with a conventional phase-locked loop 100 is the power requirement necessary to support the operation of the phase-locked loop 100. For example, the frequency divider 140 is a substantial contributor to the overall power consumption of the phase-locked loop, especially dividers of greater than a factor of 10, for example.

Consequently, a phase-locked loop that eliminates or reduces the frequency divider functionality would be advantageous to provide frequency control for various applications while reducing the amount of power required for operation of the phase-locked loop.

SUMMARY OF THE INVENTION

Accordingly, the present invention is directed to an apparatus for determining the phase difference between a reference frequency signal and an input signal. In an embodiment of the invention, the frequency sampling phase detector of the present invention may include a phase detector coupled with sample and hold circuitry. The frequency sampling phase detector of the present invention may reduce the frequency of an input signal suitable for proportional and linear phase detection by the phase detector. Advantageously, the frequency sampling phase detector of the present invention may reduce power consumption over conventional phase detectors in combination with frequency dividers.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

Those numerous objects and advantages of the present invention may be better understood by those skilled in the art by reference to the accompanying figures in which.

DETAILED DESCRIPTION OF THE INVENTION

Reference will now be made in detail to presently preferred embodiments of the invention, examples of which are illustrated in the accompanying drawings.

Figure 1:
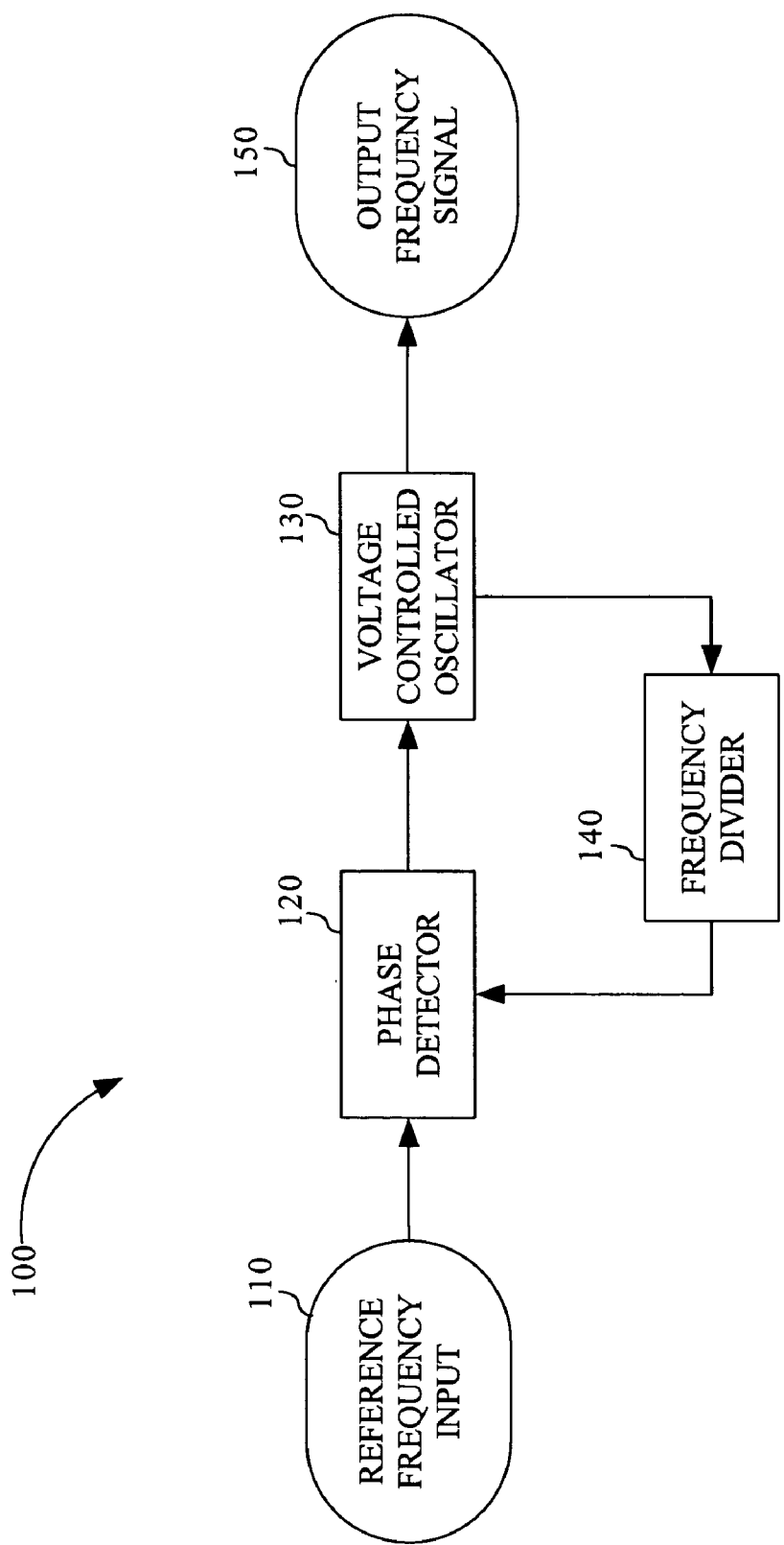
FIG. 1 depicts a block diagram of a phase-locked loop known to the art.
Figure 2:
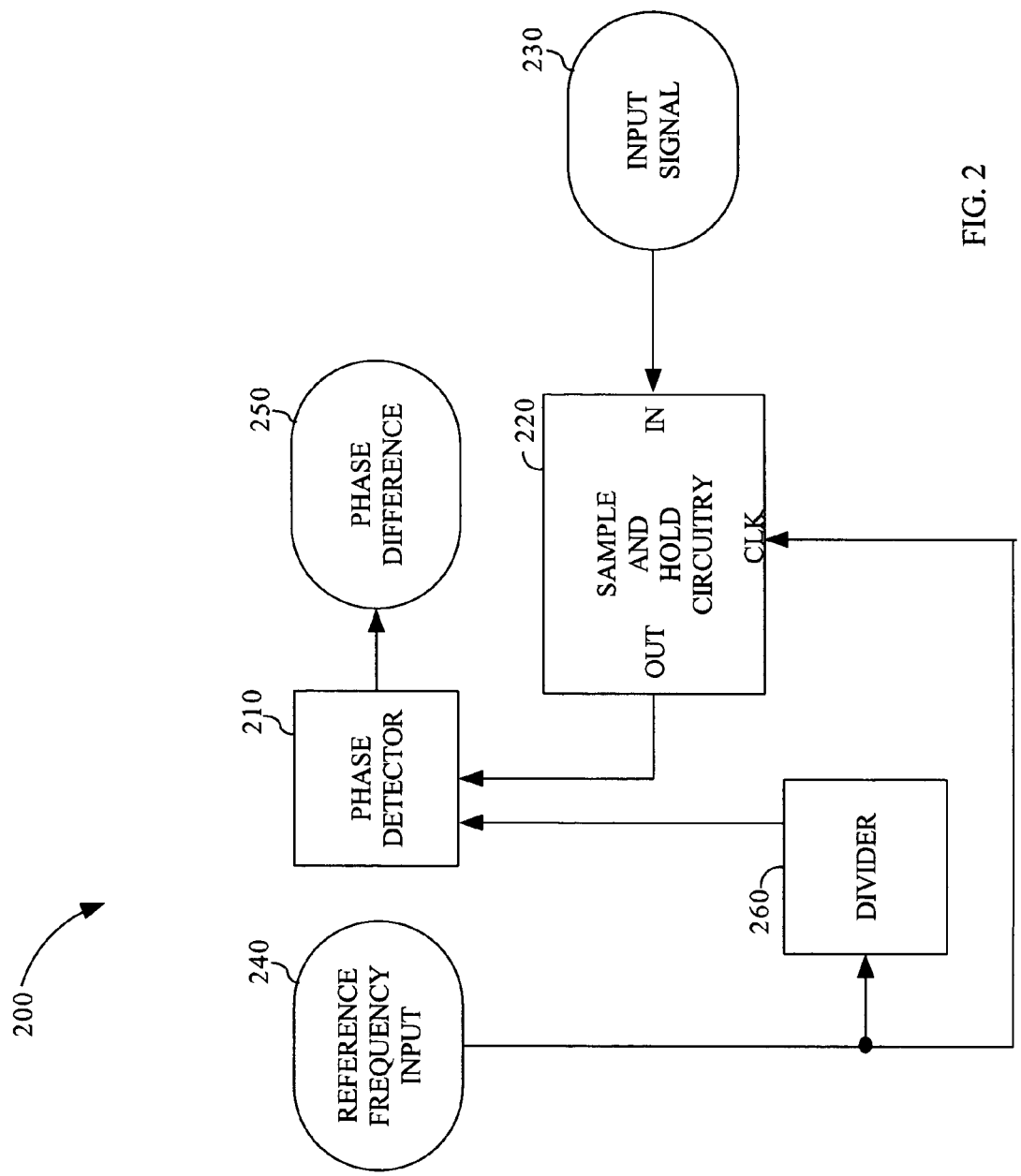
FIG. 2 depicts a block diagram of a frequency sampling phase detector in accordance with an embodiment of the present invention.

Referring to FIG. 2, a block diagram of a frequency sampling phase detector 200 in accordance with an embodiment of the present invention is shown. Frequency sampling phase detector 200 may include a phase detector 210 and sample and hold circuitry 220. Frequency sampling phase detector 200 may efficiently provide a phase difference 250 between a reference frequency input 240 and an input signal 230 while providing a reduction in circuit complexity and a reduction of power consumption.

In order to reduce the frequency for a phase detection measurement, phase detectors known to the art included frequency dividers between the input signal and the phase detector. Frequency dividers, especially frequency dividers of larger factors, consume a substantial amount of power. Advantageously, the frequency sampling phase detector 200 of the present invention may employ a phase detector 210 and sample and hold circuitry 220 to reduce the frequency of the input signal 230 to allow for proportional and linear phase detection by the phase detector 210.

Phase detector 210 may output a voltage proportional to a phase difference 250 between a reference frequency input 240 passed through a divider 260 and a sampled signal derived by the sample and hold circuitry 220. Sample and hold circuitry 220 derives the sampled signal by receiving input signal 230 and receiving a reference frequency input 240. Sample and hold circuitry 220 may be implemented in a variety of ways by those with skill in the art and may include an input, an output and a clock. The sample and hold circuitry 220 may be fabricated in a wide range of technologies including CMOS, BiCMOS, GaAs, PHEMT, or other device technologies. The implementation may utilize a FET switch, a diode ring switch or a current mode sample with different topologies. It is contemplated that any type of sample and hold circuitry implemented by those with ordinary skill in the art would not depart from the scope and intent of the present invention.

Frequency divider 260 may divide the reference frequency signal 240, the divided frequency signal being fed to the phase detector 210. Sample and hold circuitry 220 may under sample the input signal 230 to create a sampled signal with a lower frequency than the frequency of the input signal 230. In an embodiment of the invention, the output of the sample and hold circuitry 220 may be filtered prior to the phase detector 210.

Figure 3:
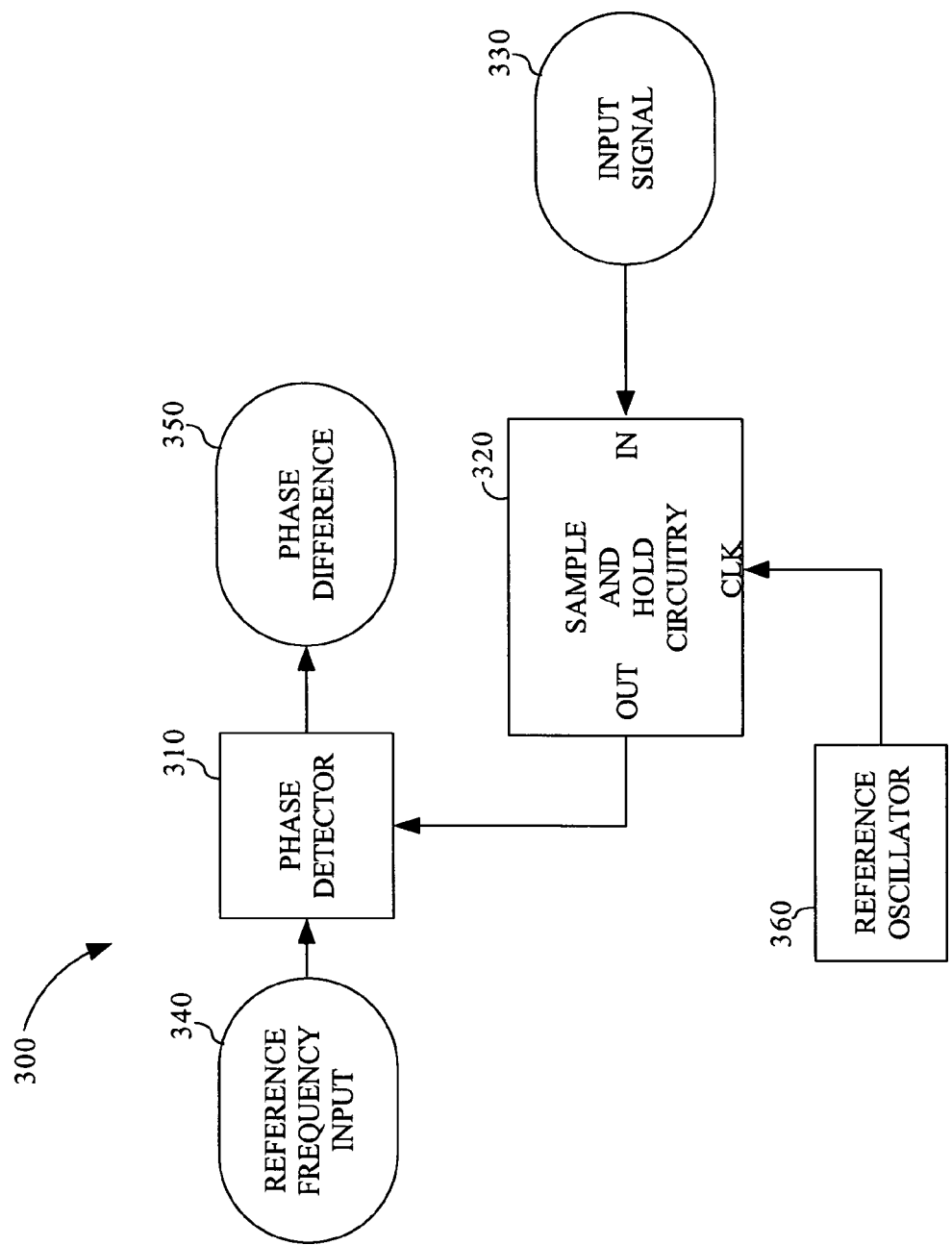
FIG. 3 depicts a block diagram of a frequency sampling phase detector in accordance with an alternative embodiment of the present invention.

Referring to FIG. 3, a block diagram of a frequency sampling phase detector 300 in accordance with an alternative embodiment of the present invention is shown. Similar to the frequency sampling phase detector 200 of FIG. 2, frequency sampling phase detector 300 may provide a phase difference 350 between a reference frequency input 340 and an input signal 330 via a phase detector 310 coupled with sample and hold circuitry 320. However, frequency sampling phase detector 300 may employ a reference oscillator 360 to supply a frequency signal which is supplied to the clock of the sample and hold circuitry 320. For example, the reference frequency input 340 may provide an 8 MHz signal where reference oscillator 360 may supply a 32 MHz frequency signal to the clock of sample and hold circuitry 320.

Figure 4:
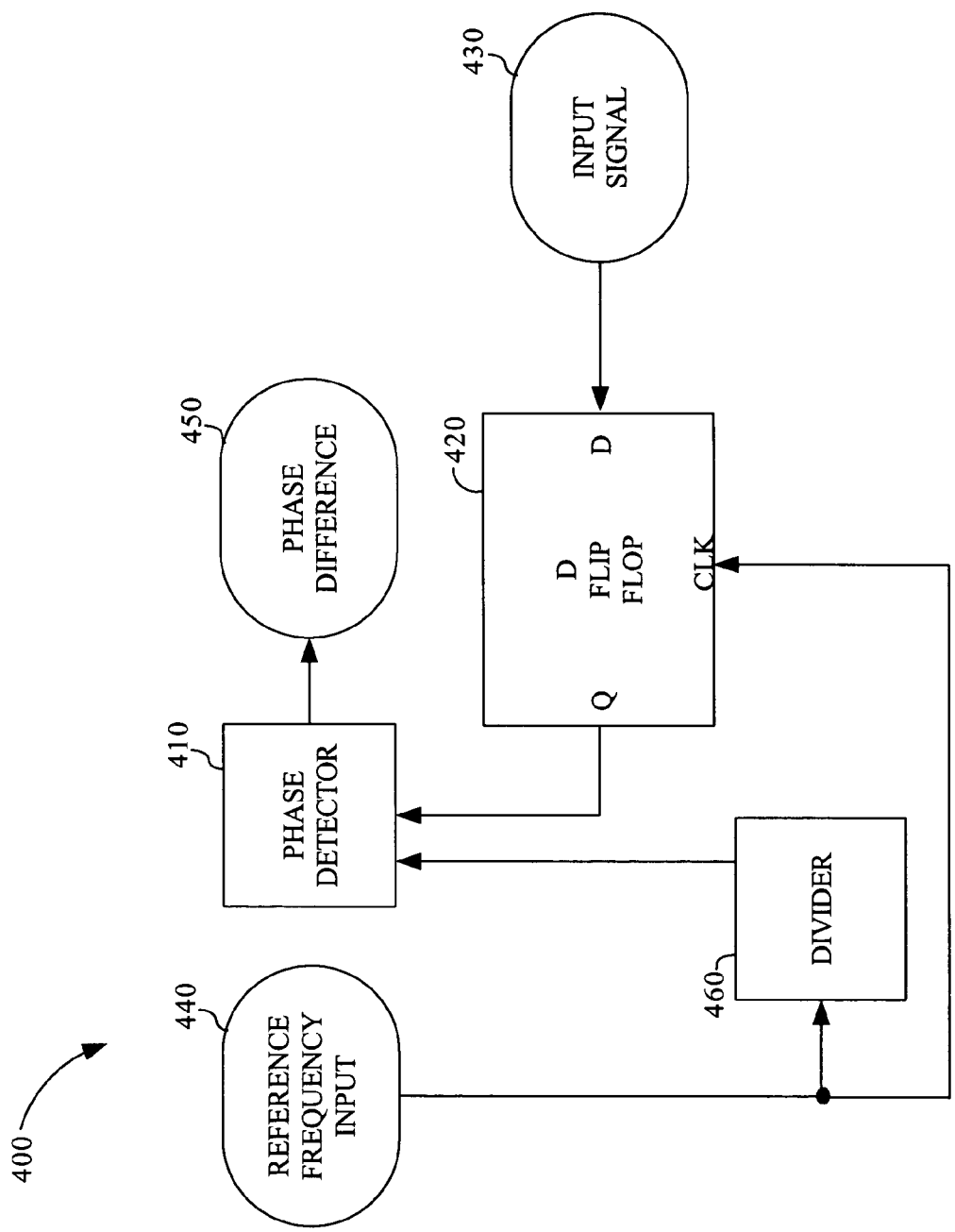
FIG. 4 depicts a block diagram of a frequency sampling phase detector in accordance with a second alternative embodiment.

Referring to FIG. 4, a block diagram of a frequency sampling phase detector 400 in accordance with a second alternative embodiment of the present invention is shown. Frequency sampling phase detector 400 may employ a D flip flop 420 as an exemplary type of sample and hold circuitry of FIGS. 2-3. Frequency sampling phase detector 400 may provide a phase difference 450 between a reference frequency input 440 and an input signal 430 via a phase detector 410 coupled with a D flip flop 420. The D input of the D flip flop 420 may be coupled to input signal 430, the Q output of the D flip flop being coupled to the phase detector 410. The clock of the D flip flop is fed by the reference frequency input 440. The output of the D flip-flop (Q) is dependent upon the present state of Q and the input (D). The transition table for a D flip-flop is shown below:

| Present State Q(t) | D | Next State Q(t + τ) |
|---|---|---|
| 0 | 0 | 0 |
| 0 | 1 | 1 |
| 1 | 0 | 0 |
| 1 | 1 | 1 |

It is contemplated that other types of sample and hold circuits may be employed by those with skill in the art to sample lower the input frequency to a desired output frequency without departing from the scope and spirit of the present invention.

Figure 5:
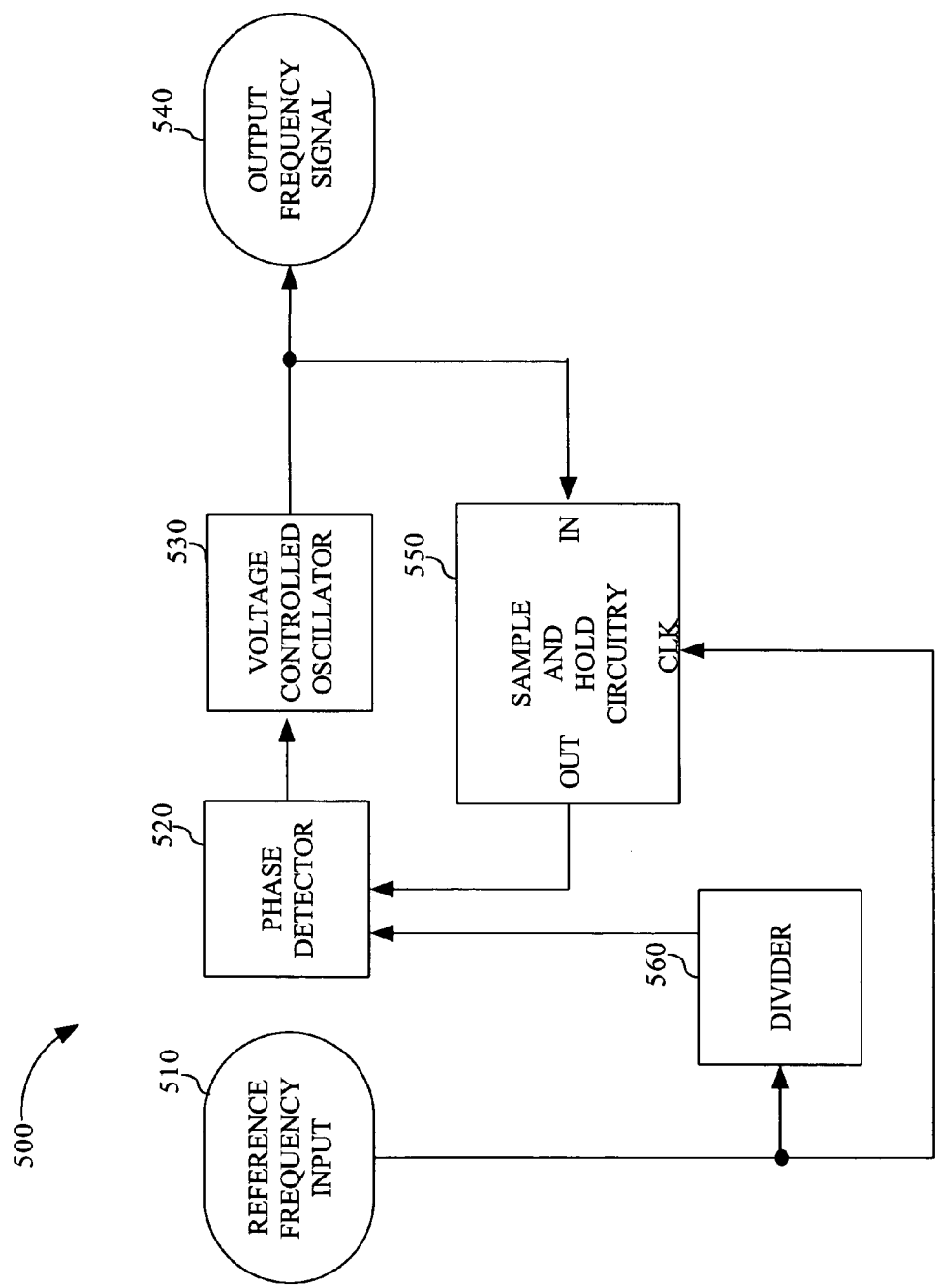
FIG. 5 depicts a block diagram of a phase-locked loop in accordance with an embodiment of the present invention.

Referring to FIG. 5, a block diagram of a phase-locked loop in accordance with an embodiment of the present invention is shown. Phase-locked loop 500 may include a reference frequency input 510, phase detector 520, voltage controlled oscillator 530, sample and hold circuitry 550 and a frequency divider 560. Phase-locked loop 500 may produce an output frequency signal 540. Sample and hold circuitry 550 may be employed for the feedback path of phase-locked loop 500.

Advantageously, the sample and hold circuitry 550 may minimize the frequency at which the voltage controlled oscillator must operate. This is advantageous as it reduces the power consumption of the voltage controlled oscillator 530. Additionally, sample and hold circuitry 550 may eliminate or reduce the frequency divider circuitry in a feedback path from the voltage controlled oscillator 530. For instance, a divider may be coupled between the voltage controlled oscillator 530 and the input of sample and hold circuitry 550 in an alternative embodiment of the invention.

The sample and hold circuitry 550 may sample the frequency signal produced by the voltage controlled oscillator 530. The output of the sample and hold circuitry 550 may be compared with a divided frequency signal output of frequency divider 560. This may be referred to as harmonic sampling, which results in a direct current or voltage dependent on the phase difference between the reference signal and the frequency signal of the voltage controlled oscillator 530. Sample and hold circuitry 550 may provide phase locking which may permit proper operation with low power consumption.

In an advantageous aspect of the present invention, sample and hold circuitry 550 may be capable of reducing an input frequency of approximately 200 MHz to 8 MHz. This is advantageous as it may allow the phase detector with an input of 8 MHz to provide a linear and proportional voltage output based upon the phase difference between the divided reference signal and the frequency signal of the voltage controlled oscillator 530.

Figure 6:
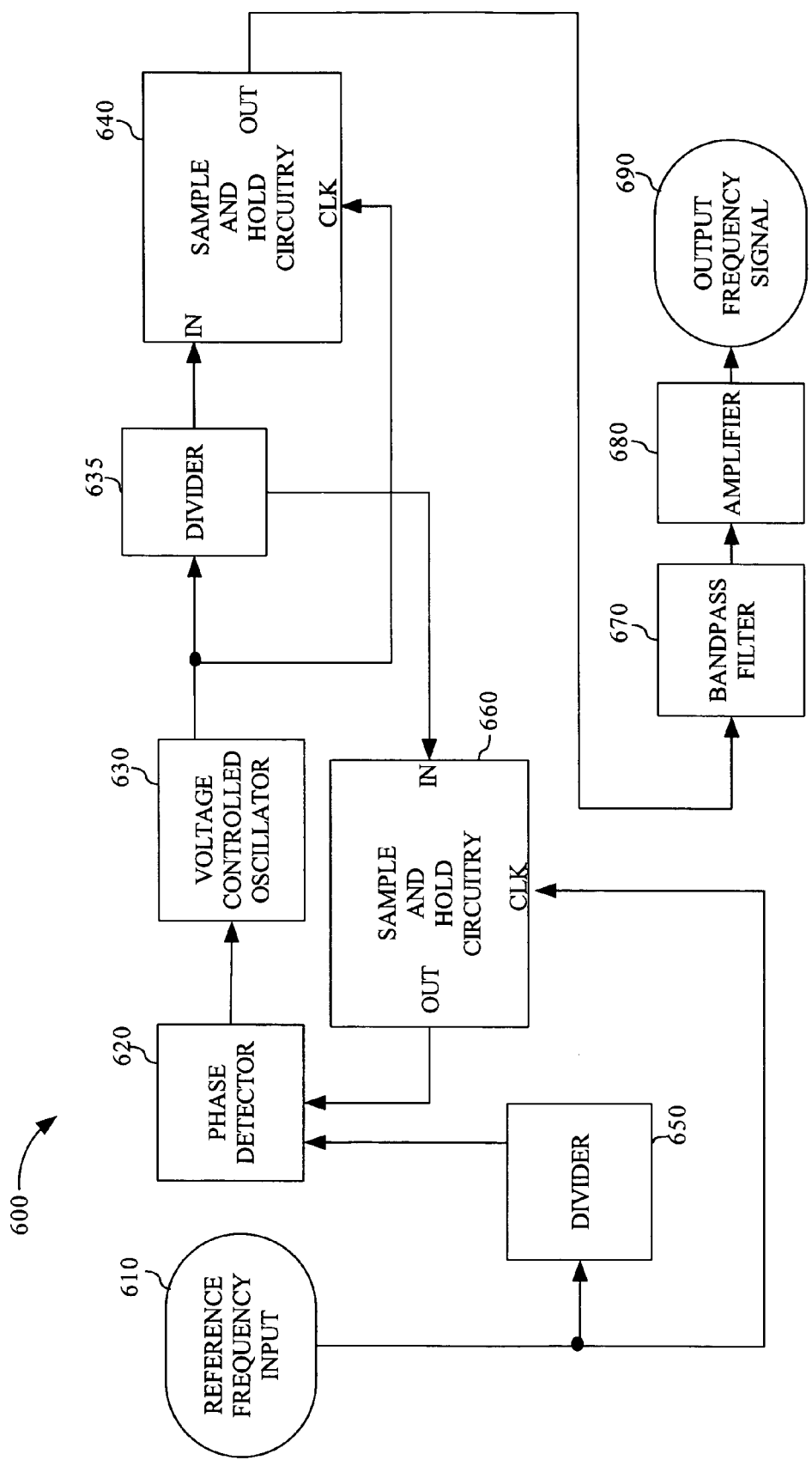
FIG. 6 depicts a block diagram of a phase-locked loop in accordance with an alternative embodiment of the present invention.

Referring to FIG. 6, a block diagram of a phase-locked loop 600 in accordance with an alternative embodiment of the present invention is shown. Similar to phase-locked loop 500 of FIG. 5, phase-locked loop 600 may include a reference frequency input 610, phase detector 620, voltage controlled oscillator 630, sample and hold circuitry 660 and a frequency divider 650. Phase-locked loop 600 may produce an output frequency signal 690. Sample and hold circuitry 660 may be employed for the feedback path of phase-locked loop 600.

Additionally, phase-locked loop 600 may include sample and hold circuitry 640 and a divider 635 coupled with voltage controlled oscillator 630. The output of the sample and hold circuitry 640 may be coupled to a bandpass filter 670 and amplifier 680 to refine the output frequency signal 690.

Sample and hold circuitry 640 may derive a higher output frequency signal 690 than the frequency signal produced by the voltage controlled oscillator. For example, sample and hold circuitry 640 may create images of an input signal folded around multiples of a clock frequency. This is advantageous as an output frequency signal 690 may be produced with reduced power consumption due to the reduced voltage controlled oscillator frequency of voltage controlled oscillator 630.

For example, in an embodiment of the invention, reference frequency input 610 may produce a signal with a frequency of 32 MHz. Divider 650 may may be a divide by four (4) divider, creating an 8 MHz reference signal for phase detector 620. The 32 MHz signal from the reference frequency input 610 may be fed to the clock of sample and hold circuitry 660. Voltage controlled oscillator 630 may be an 800 MHz voltage controlled oscillator. Frequency divider 635 may be a divide by four (4) divider, creating a 200 MHz signal to the sample and hold circuitry 640. The 200 MHz signal may also be fed to the input of sample and hold circuitry 660.

Sample and hold circuitry 660 may be capable of reducing an input frequency of approximately 200 MHz to 8 MHz. This is advantageous as it may allow the phase detector 620 with a reference frequency input of 8 MHz to provide a linear and proportional voltage output based upon the phase difference between the divided reference signal and the output of sample and hold circuitry 660.

The clock of the sample and hold circuitry 640 may be the coupled to the 800 MHz frequency signal produced by the voltage controlled oscillator 630. Through sampling, an output frequency signal 690 of 3.4 GHz may be produced. In conventional voltage controlled oscillators, the voltage controlled oscillator would need to be closer to the desired output frequency. The amount of power consumed by voltage controlled oscillators is proportional to the oscillating frequency. Thus by lowering the frequency of voltage controlled oscillator 630 in combination with the sample and hold circuitry 640, phase-locked loop 600 may realize reduced power consumption.

Multiple combinations of embodiments of the invention have been described. It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A phase-locked loop, comprising:
   a phase detector;
   a voltage controlled oscillator coupled to said phase detector; and
   sample and hold circuitry, said sample and hold circuitry including an input, an output and a clock, said input of said sample and hold circuitry being coupled to an output of said voltage controlled oscillator, said clock of said sample and hold circuitry being fed by a reference frequency signal, wherein said phase detector measures a phase difference between a divided frequency signal and a second signal, said divided frequency signal being divided from said reference frequency signal, said second signal being produced by said sample and hold circuitry from an output frequency signal produced by said voltage controlled oscillator, said second signal having a lower frequency than said output frequency signal produced by said voltage controlled oscillator.

2. The phase-locked loop as claimed in claim 1, said reference frequency signal being produced by a reference oscillator.

3. The phase-locked loop as claimed in claim 1, wherein said sample and hold circuitry is a D flip flop.

4. The phase-locked loop as claimed in claim 1, further comprising a filter, said output frequency signal being supplied to said filter.

5. The phase-locked loop as claimed in claim 4, further comprising an amplifier, said amplifier coupled to said filter.

6. A phase-locked loop, comprising:
   a phase detector;
   a first sample and hold circuitry coupled to said phase detector;
   a voltage controlled oscillator coupled to said phase detector; and
   a second sample and hold circuitry, said first sample and hold circuitry and said second sample and hold circuitry each having an input, an output, and a clock, wherein said first sample and hold circuitry provides a feedback path from said voltage controlled oscillator to said phase detector, said output of said second sample and hold circuitry converting a signal produced by said voltage controlled oscillator to an output frequency signal, said clock of said first sample and hold circuitry being fed by a reference frequency signal, said phase detector measures a phase difference between a divided frequency signal and a second signal, said divided frequency signal being divided from said reference frequency signal, and said second signal being produced by said first sample and hold circuitry.

7. The phase-locked loop as claimed in claim 6, wherein said phase difference from said phase detector is supplied to said voltage controlled oscillator.

8. The phase-locked loop as claimed in claim 7, wherein said reference frequency signal is produced by a reference oscillator.

9. The phase-locked loop as claimed in claimed in claim 6, wherein said clock of said second sample and hold circuitry is fed by said signal produced by said voltage controlled oscillator.

10. The phase-locked loop as claimed in claim 6, wherein said first sample and hold circuitry is a D flip flop.

11. The phase-locked loop as claimed in claim 6, wherein said second sample and hold circuitry is a D flip flop.

12. The-phase-locked loop as claimed in claim 6, further comprising a filter, said output frequency signal being supplied to said filter.

13. The phase-locked loop as claimed in claim 12, further comprising an amplifier, said amplifier coupled to said filter.

* * * * *